United States Patent [19]
Bohrer

[11] Patent Number: 5,717,350
[45] Date of Patent: Feb. 10, 1998

[54] DEGENERATED DIFFERENTIAL PAIR WAVEFORM BUILDER

[75] Inventor: Mark William Bohrer, Saratoga, Calif.

[73] Assignee: Micro Linear Corporation, San Jose, Calif.

[21] Appl. No.: 610,798

[22] Filed: Mar. 7, 1996

Related U.S. Application Data

[63] Continuation of Ser. No. 336,628, Nov. 9, 1994, abandoned.

[51] Int. Cl.$^6$ ..................................................... H03B 21/00
[52] U.S. Cl. ........................ 327/705; 327/100; 327/134; 327/339; 327/361
[58] Field of Search ............................... 327/361, 105, 327/107, 129, 130, 131, 134, 355, 350, 352, 339, 336, 334, 100, 126, 127; 375/205, 206

[56] References Cited

U.S. PATENT DOCUMENTS

| | | | |
|---|---|---|---|
| 3,946,152 | 3/1976 | Illetschko et al. | 178/7.1 |
| 4,001,701 | 1/1977 | Rosso et al. | 327/361 |
| 4,030,121 | 6/1977 | Faroudja | 358/37 |
| 4,311,929 | 1/1982 | Konrad et al. | 327/361 |
| 4,555,673 | 11/1985 | Huijsing et al. | 330/258 |
| 4,806,880 | 2/1989 | Laws | 327/336 |
| 4,841,251 | 6/1989 | Hartmann et al. | 327/361 |
| 4,962,344 | 10/1990 | Bohrer | 327/134 |
| 5,045,732 | 9/1991 | Sugiura et al. | 327/361 |
| 5,189,313 | 2/1993 | Garuts | 327/170 |
| 5,357,155 | 10/1994 | Wile | 327/361 |
| 5,410,188 | 4/1995 | Segaram | 327/237 |

Primary Examiner—Timothy P. Callahan
Assistant Examiner—Kenneth B. Wells
Attorney, Agent, or Firm—Haverstock & Associates

[57] ABSTRACT

A degenerated differential pair waveform builder has a single ramp generator control circuit and a plurality of differential pairs. A trigger input is generated and input to the ramp generator control circuit. The ramp generator control circuit then generates a differential signal which is output to each of the differential pairs through a positive edge signal node and a negative edge signal node. Each differential pair then generates an output in response to the differential signal output from the ramp generator control circuit. The outputs from the differential pairs are combined in a summing circuit which outputs a composite waveform. Each differential pair has an associated ramp time which is dependent upon the value of the resistance in its emitter circuit. The ramp time of each differential pair directly affects the slope of its resulting output waveform. By combining the output waveforms from all the differential pairs, each having a different ramp time and slope, a complicated composite waveform can be output having the desired shape and content.

21 Claims, 5 Drawing Sheets

DEGENERATED DIFFERENTIAL PAIR WAVEFORM BUILDER

This is a continuation of U.S. application Ser. No. 08/336,628 filed on Nov. 9, 1994, now abandoned.

FIELD OF THE INVENTION

The present invention relates to the field of signal generators. More specifically, the present invention relates to the field of signal generation by combining a plurality of signals into a single complex waveform.

BACKGROUND OF THE INVENTION

Various techniques have been used to generate complex waveforms in the past. Subtractive synthesis is one well known technique which uses a plurality of analog filters to filter out selected frequencies and/or bands of frequencies from a waveform such as a squarewave or sawtooth to produce a desired waveform. The analog filters are made up of RC networks which are typically sensitive to manufacturing and/or process variations. These sensitivities and variations can make it difficult to achieve desired waveforms.

Ramp generators are also used to generate waveforms. A ramp generator provides an output, either current or voltage, which ramps either up or down from a predetermined initial magnitude to a predetermined final magnitude in a linear fashion. A plurality of ramp generators have been operated in sequence so that as each ramp generator reaches its predetermined final magnitude, the next ramp generator is triggered to provide its output until the desired waveform is provided. The number of ramp generators required and the slope and duration of each of their outputs will depend on the complexity, or harmonic content, of the waveform desired.

The use of ramp generators as described above, requires that the final and initial outputs of each of the ramp generators in the sequence be exactly matched and that the trigger signals be timed precisely so that undesired inflections and discontinuities are not produced in the waveform being generated. When a large number of ramp generators are used it is difficult to achieve such precise matching and operation.

A Segmented Waveform Generator which uses a plurality of ramp generators was introduced by Mark W. Bohrer, the inventor of the present invention, in U.S. Pat. No. 4,962,344. This device sums a plurality of ramp generators in a summing circuit in order to output a waveform which has a desired harmonic content or shape. One of the plurality of ramp generators is illustrated in FIG. 1. Each ramp generator is controlled by a differential trigger signal, which is coupled through a buffer to the transistors Q1 and Q2. The emitters of the transistors Q1 and Q2 are coupled to control the transistors Q3 and Q4, respectively. The collectors of the transistors Q3 and Q4 then provide the outputs RAMP OUT from the ramp generator. The output from a plurality of these ramp generators are then combined in a summing circuit in order to generate the complex waveform desired.

What is needed is a waveform generator which has a single ramp generator controlling circuit providing signals for controlling a plurality of differential pairs, each differential pair capable of starting at a different point in time and outputting a waveform having a different slope from the other differential pairs, thus making it relatively easy to generate changes in slope of the resulting composite waveform.

SUMMARY OF THE INVENTION

A degenerated differential pair waveform builder has a single ramp generator control circuit and a plurality of differential pair circuits. A trigger input is generated and input to the ramp generator control circuit. The ramp generator control circuit then generates a differential signal which is output to each of the differential pairs through a positive edge signal node and a negative edge signal node. Each differential pair then generates an output in response to the differential signal from the ramp generator control circuit. The outputs from the differential pairs are combined in a summing circuit which outputs a composite waveform. Each differential pair has an associated ramp time which is dependent upon the value of the resistance in its emitter circuit. The ramp time of each differential pair directly affects the slope of its resulting output waveform. By combining the output waveforms from all the differential pairs, each having a different ramp time and slope, a complicated composite waveform can be output having the desired shape and content.

DETAILED DESCRIPTION OF THE PREFERRED EMBODIMENT

Figure 1:
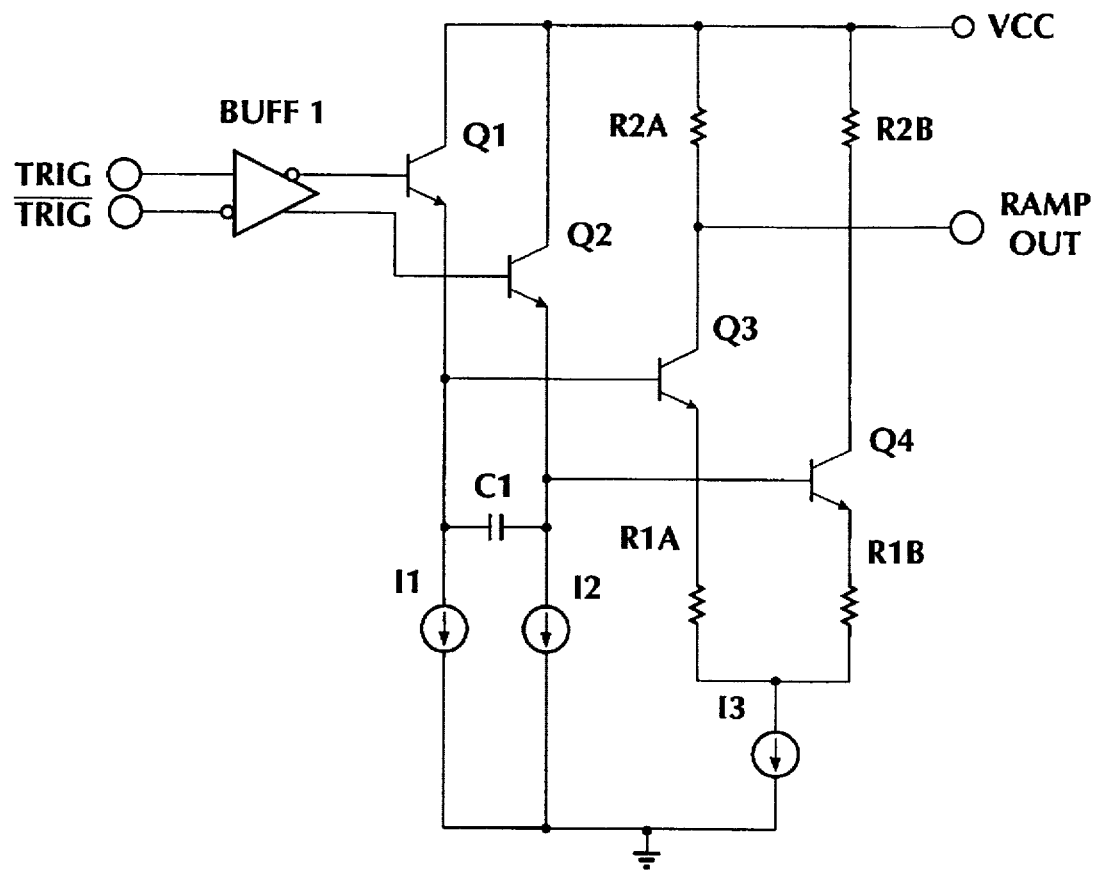
FIG. 1 illustrates a schematic diagram of a ramp generator of the prior art.
Figure 2:
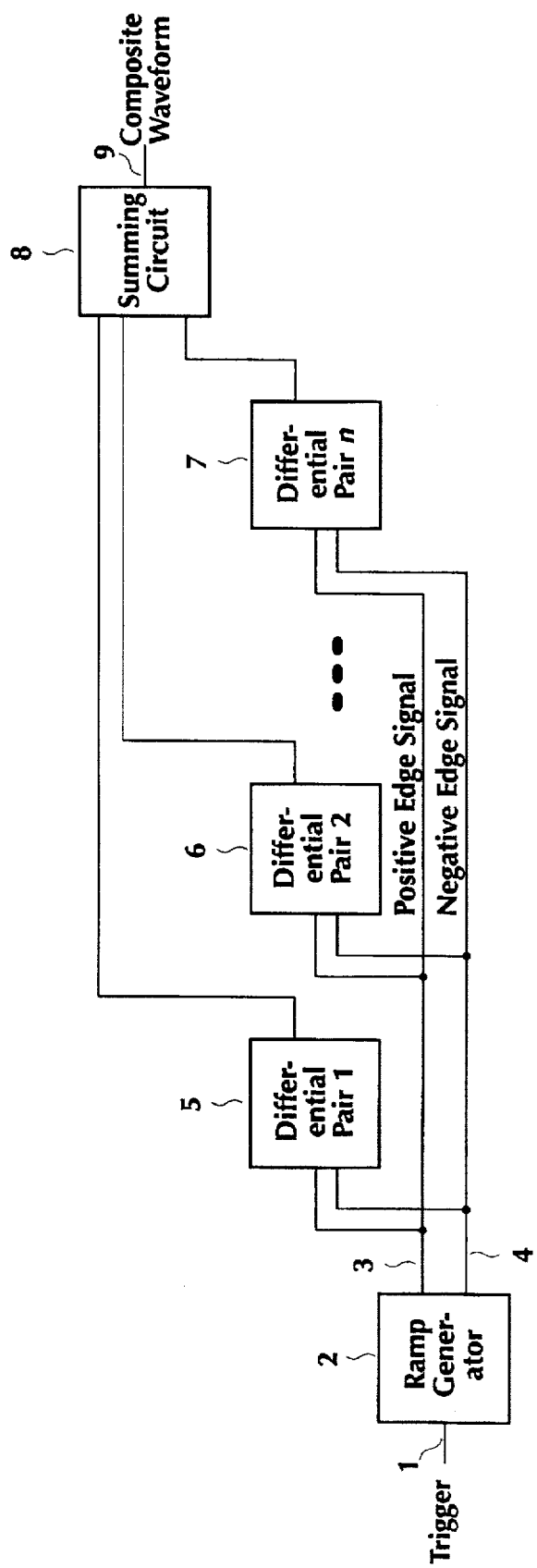
FIG. 2 illustrates a generalized block diagram of a degenerated differential pair waveform builder of the present invention.

A generalized block diagram of a degenerated differential pair waveform builder of the present invention is illustrated in FIG. 2. A trigger signal input 1 is coupled to a ramp generator 2 for controlling the content of the resulting waveform. A positive edge signal 3 and a negative edge signal 4 are output from the ramp generator for controlling a plurality of differential pairs 5, 6, 7. The plurality of differential pairs 5, 6, 7 then each output a signal in response to the positive edge signal 3 and the negative edge signal 4. The outputs from the plurality of differential pairs 5, 6, 7 are combined and summed in a summing circuit 8 and a resulting composite waveform 9 is output from the summing circuit 8.

Figure 3:
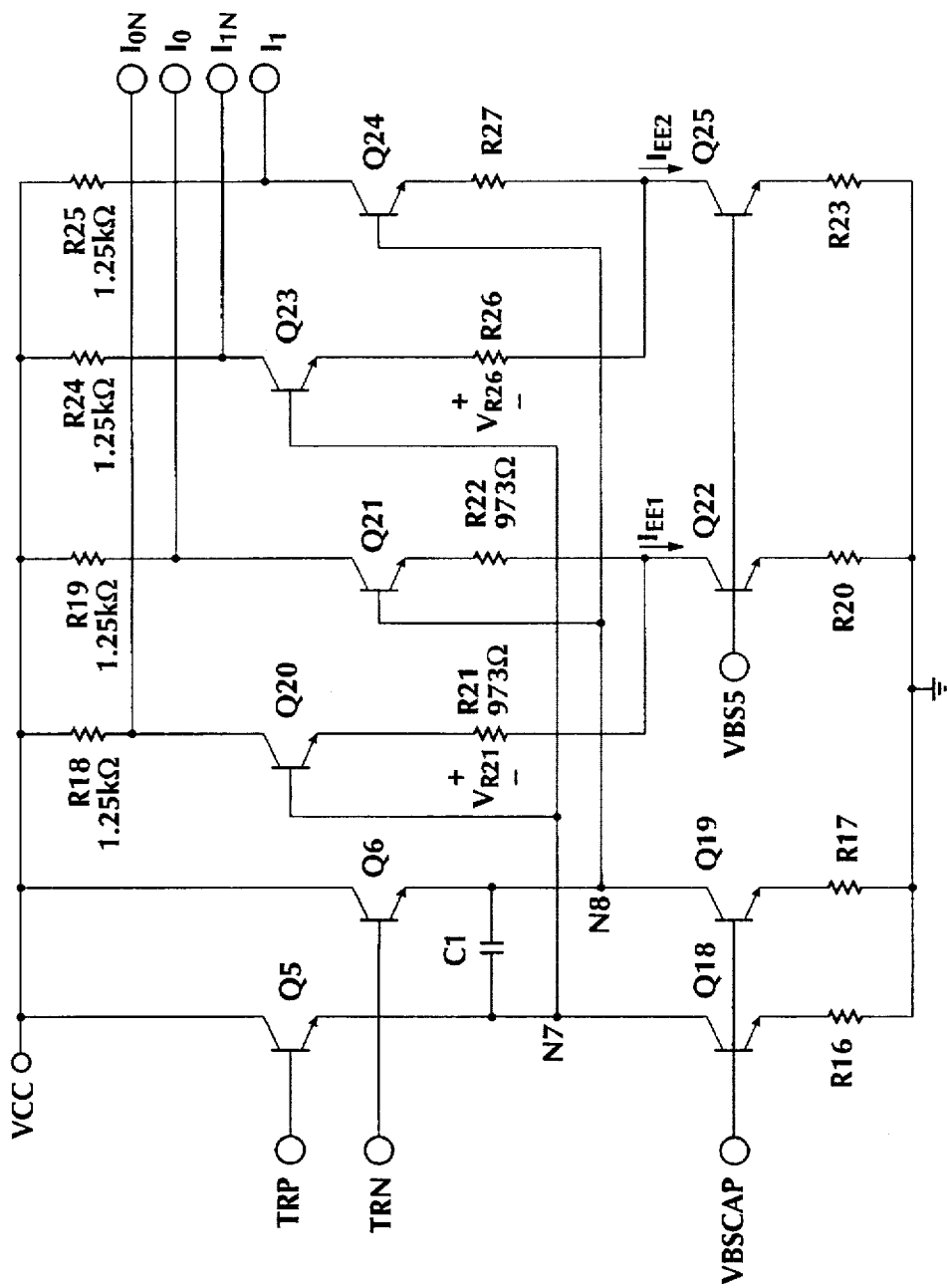
FIG. 3 illustrates a circuit diagram of a degenerated differential pair waveform builder of the present invention.

A more detailed circuit diagram of the generalized block diagram of FIG. 2 is illustrated in FIG. 3. The ramp generator 2 is comprised of the transistors Q5, Q6, Q18, Q19, the capacitor C1 and the resistors R16, R17. The differential trigger signal input is comprised of the signal TRP and the signal TRN. The positive trigger signal TRP is coupled to the base of the transistor Q5 and the negative trigger signal TRN is coupled to the base of the transistor Q6.

The collectors of both of the transistors Q5, Q6 are coupled to the positive power supply $V_{CC}$. A capacitor C1 is coupled between the emitters of the transistors Q5, Q6. The collector of the transistor Q18 is coupled to the emitter of the transistor Q5 and a first terminal of the capacitor C1, forming the node N7. The node N7 corresponds to the positive edge signal 3 (FIG. 2).

The collector of the transistor Q19 is coupled to the emitter of the transistor Q6 and a second terminal of the capacitor C1, forming the node N8. The node N8 corresponds to the negative edge signal 4 (FIG. 2).

A first terminal of the resistor R16 is coupled to the emitter of the transistor Q18 and a second terminal of the resistor R16 is coupled to ground thereby forming a current sink. A first terminal of the resistor R17 is coupled to the emitter of the transistor Q19 and a second terminal of the resistor R17 is coupled to ground also forming a current sink. The input signal VBSCAP is coupled to the base of the transistors Q18, Q19 for controlling their operation.

The circuit of FIG. 3 also comprises two differential pairs. The first differential pair 5 is comprised of the transistors Q20, Q21 and the resistors R18, R19, R21, R22. The base of the transistor Q20 is coupled to the node N7. The resistor R18 is coupled between the power supply $V_{CC}$ and the collector of the transistor Q20. The base of the transistor Q21 is coupled to the node N8. The resistor R19 is coupled between the power supply $V_{CC}$ and the collector of the transistor Q21. A first terminal of the resistor R21 is coupled to the emitter of the transistor Q20 and a first terminal of the resistor R22 is coupled to the emitter of the transistor Q21. The second terminals of the resistor R21 and the resistor R22 are coupled to each other and to the collector of the transistor Q22. A signal VBS5 is coupled to the base of the transistor Q22 for controlling the operation of the transistor Q22. A first terminal of the resistor R20 is coupled to the emitter of the transistor Q22 and a second terminal of the resistor R20 is coupled to ground forming a current sink for the first differential pair.

The second differential pair of the circuit of FIG. 3 is comprised of the transistors Q23, Q24 and the resistors R24, R25, R26, R27. The base of the transistor Q23 is coupled to the node N7. The resistor R24 is coupled between the power supply $V_{CC}$ and the collector of the transistor Q23. The base of the transistor Q24 is coupled to the node N8. The resistor R25 is coupled between the power supply $V_{CC}$ and the collector of the transistor Q24. A first terminal of the resistor R26 is coupled to the emitter of the transistor Q23 and a first terminal of the resistor R27 is coupled to the emitter of the transistor Q24. The second terminals of the resistor R26 and the resistor R27 are coupled to each other and to the collector of the transistor Q25. The signal VBS5 is coupled to the base of the transistor Q25 for controlling the operation of the transistor Q25. A first terminal of the resistor R23 is coupled to the emitter of the transistor Q25 and a second terminal of the resistor R23 is coupled to ground forming a current sink for the second differential pair.

Additional differential pairs can be coupled to the circuit of FIG. 3 in the same manner as the first and second differential pairs. Each additional differential pair will have a base of one of the transistors coupled to the positive edge signal node N7 and a base of the other transistor coupled to the negative edge signal node N8. Each transistor of the differential pair will have its collector coupled to $V_{CC}$ through a first resistor and its emitter coupled to a current sink through a second resistor. The second resistors will have one terminal coupled to the emitter of a respective transistor and their remaining terminals coupled together and to the current sink. In this manner a plurality of differential pairs can be controlled by the ramp generator 2 (FIG. 2) and can add to the composite waveform 9 (FIG. 2).

As shown in FIG. 2, the outputs for the differential pairs are taken from their collectors, and then the outputs from each differential pair are combined in the summing circuit 8 and output as the composite waveform 9. This summing circuit can be implemented by any well known technique. For the first differential pair of the circuit illustrated in FIG. 3, the difference between the output I0N and the output I0 is taken as the output for the first differential pair. The output I0N is taken from the collector of the transistor Q20 which is coupled to the positive edge signal node N7 and the output I0 is taken from the collector of the transistor Q21 which is coupled to the negative edge signal node N8. The output for the second differential pair is the difference between the output I1N and the output I1. The output I1N is taken from the collector of the transistor Q23 which is coupled to the positive edge signal node N7 and the output I1 is taken from the collector of the transistor Q24 which is coupled to the negative edge signal node N8.

Figure 4:
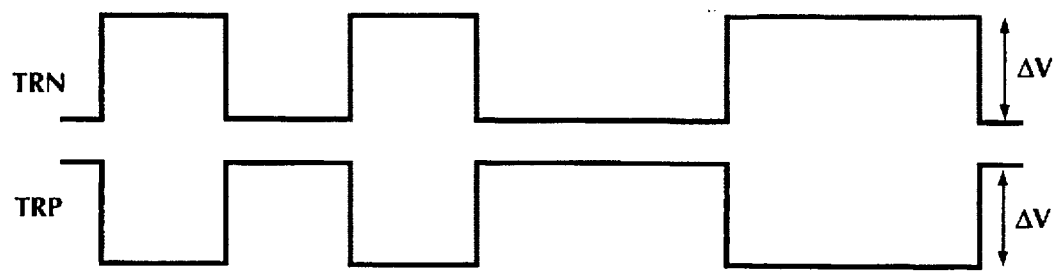
FIG. 4 illustrates an example of differential trigger signals which are input to the control circuit.

The waveform illustrated in FIG. 4 is an example of a positive and negative trigger signal waveform which might be input to the degenerated differential pair waveform builder at the trigger signal input 1. FIGS. 5–9 illustrate resulting waveforms which are taken at different points within the waveform builder in response to the trigger signal waveforms illustrated in FIG. 4.

Figure 5:
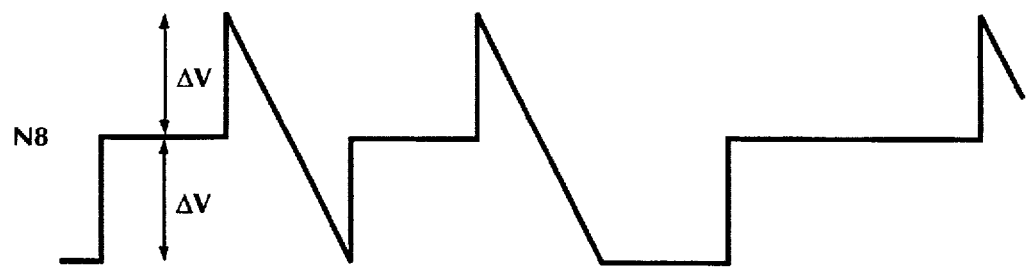
FIG. 5 illustrates an example of a negative edge control signal output from the signal node N8 of the control circuit in response to the differential trigger signals of FIG. 4.
Figure 6:
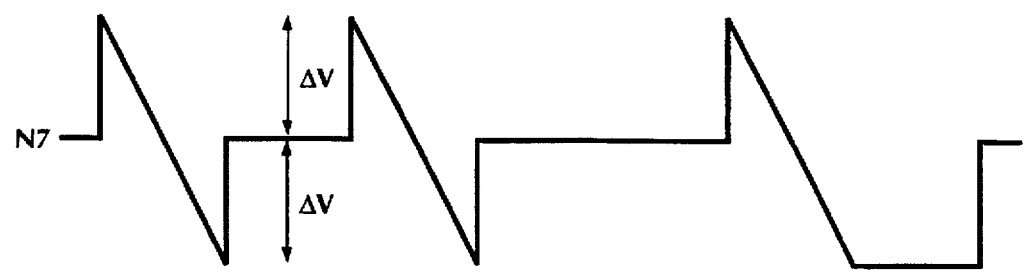
FIG. 6 illustrates an example of a positive edge control signal output from the signal node N7 of the control circuit in response to the differential trigger signals of FIG. 4.

FIG. 5 shows the waveform taken at the negative edge signal node N8, which is the emitter of the transistor Q6, in response to the negative trigger signal waveform TRN. FIG. 6 shows the waveform taken at the positive edge signal node N7, which is the emitter of the transistor Q5, in response to the positive trigger signal waveform TRP. As shown in FIG. 4 the negative trigger signal TRN and the positive trigger signal TRP are differential input signals, so that when the negative trigger signal TRN is at a high level $V_H$, the positive trigger signal TRP will be at a low level $V_L$. The difference between $V_H$ and $V_L$ will be referred to as $\Delta V$. For purposes of this description a rising trigger signal edge and a falling trigger signal edge will refer to the respective edges of the positive trigger signal TRP.

At a rising trigger signal edge for the positive trigger signal TRP, the positive trigger signal TRP will be at the high voltage $V_H$ and drive the base of the transistor Q5 to the same level and the negative trigger signal TRN will be at the low voltage and drive the base of the transistor Q6 to the same level. The emitter of the transistor Q5 will rise at almost the same rate as its base, bringing the positive signal node N7 up to a diode drop below $V_H$. Before the occurrence of the rising trigger signal edge on TRP, the capacitor C1 had charged up to the voltage level $\Delta V$. Because the capacitor C1 is charged up to the voltage level $\Delta V$ and further, because the voltage across a capacitor cannot change instantaneously, the emitter of the transistor Q6 and the negative signal node N8 will rise as the emitter of the transistor Q5 rises, up to a voltage level $\Delta V$ above the voltage level of the emitter of the transistor Q5. The transistor Q6 is turned off because its base is at $V_L$ and its emitter 2 $\Delta V$ minus a diode voltage drop above $V_L$, and therefore assuming the signal VBSCAP is high, the transistor Q19 and the resistor R17 will cause the negative signal node N8 to ramp down to a voltage level $\Delta V$ below the voltage level of the positive signal node N7. The rate $\Delta t$ for this ramp time is given by the equation:

(1) $\Delta t = (2\Delta V \times C1)/I_{C19}$

At a falling trigger signal edge for the positive trigger signal TRP, the positive trigger signal TRP will be at the low voltage $V_L$ and drive the base of the transistor Q5 to the same level and the negative trigger signal TRN will be at the high voltage $V_H$ and drive the base of the transistor Q6 to the same level. The emitter of the transistor Q6 will rise at almost the same rate as its base bringing the positive signal node N7 up to a diode drop below $V_H$. Before the rising trigger signal edge on TRN, the capacitor C1 had charged up to the voltage level $\Delta V$. Because the capacitor C1 is charged up to the voltage level $\Delta V$, the emitter of the transistor Q5 and the negative signal node N8 will rise as the emitter of the transistor Q6 is rising, up to a voltage level $\Delta V$ above the voltage level of the emitter of the transistor Q6. Because the transistor Q5 is now turned off, the transistor Q18 and the resistor R16 will cause the positive signal node N7 to ramp down to a voltage level $\Delta V$ below the voltage level of the negative signal node N8.

If the resistors R21, R22 are chosen such that they cause the transistors Q20, Q21 to switch over the entire range of the ramps of the positive edge trigger signal node N7 and the negative edge trigger signal node N8, the outputs I0N, I0 will also generate ramp waveforms which have a ramp time $\Delta t$. The ratio of the voltage drop across the resistor R21, if the transistor Q20 is on, or across the resistor R22, if the transistor Q21 is on, to the single-ended input voltage swing $\Delta V$ will determine how much of the swing either the transistor Q20 or the transistor Q21 will use to switch from off to on, or on to off. If the resistors R21, R22 are chosen such that the entire single-ended input swing $\Delta V$ takes place in the time $\Delta t$, then the transistors Q20, Q21 will switch in the same time $\Delta t$.

The resistor values to be used in the remaining differential pairs can be chosen such that each differential pair has a different ramp time $\Delta t$. This will allow complicated waveforms to be approximated very accurately. The different ramp times can cause the slope of the composite waveform to be different at different points in time, thus allowing a positive sloped curve or a negative sloped curve to be output in the composite waveform 9.

The resistors R26, R27 used in the second differential pair can be chosen so that this differential pair will have a different ramp time $\Delta t$. If the ratio of the voltage drop across the resistor R26, if the transistor Q23 is on, or across the resistor R27, if the transistor Q24 is on, to the single-ended input swing $\Delta V$ is chosen such that the voltage drop $V_{R26}$ across the resistor R26 divided by the voltage drop $V_{R21}$ across the resistor R21 is less than one, then the transistors Q23, Q24 will switch in the time represented by this voltage ratio $V_{R26}/V_{R21}$ multiplied by the ramp time $\Delta t$ of the first differential pair. The switching times or edges of the transistors Q21, Q22, Q23, Q24 will be centered at the zero crossing of the differential ramp at the positive trigger signal node N7 and the negative trigger signal node N8.

In the preferred embodiment of the present invention, the circuit is manufactured as a monolithic integrated circuit. The resistors R18, R19, R24, R25 all have a value of 1.25 K$\Omega$; the resistors R21, R22 each have a value of 973 $\Omega$; the resistors R26, R27 each have a value of approximately 486.5 $\Omega$; the resistors R16, R17, R20, R23 all have a value of 1.25K $\Omega$; the transistors Q5, Q6, Q18, Q19, Q20, Q21, Q22, Q23, Q24, Q25 are all of the type NPN; and the capacitor C1 has a value of 5 pF.

Figure 7:
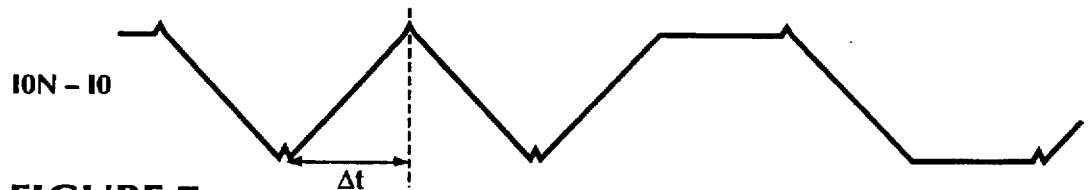
FIG. 7 illustrates an output waveform generated from the first differential pair in response to the control signals from the signal nodes N7 and N8.

The output for the first differential pair I0N–I0 is illustrated in the waveform of FIG. 7. As is shown the ramp time for the output of the first differential pair is $\Delta t$. When a trigger signal level is maintained for more than the time $\Delta t$, the waveform will have a constant output at either a level of $+I_{EE1} \times R18$ or $-I_{EE1} \times R18$, where $I_{EE1}$ is the value of the current that flows through the current sink comprised of the transistor Q22 and the resistor R20.

Figure 8:
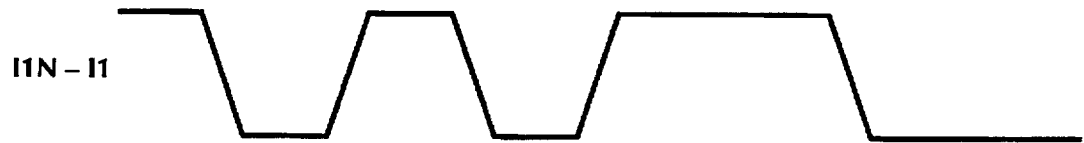
FIG. 8 illustrates an output waveform generated from the second differential pair in response to the control signals from the signal nodes N7 and N8.

The output for the second differential pair I1N–I1 is illustrated in the waveform of FIG. 8. The resistor values for the second differential pair, for this example, have been chosen such that the voltage ratio $V_{R26}/V_{R21}$ is equal to ½. As is illustrated in the waveform of FIG. 8, the ramp time of the output of the second differential pair is half that of the ramp time of the first differential pair. When a trigger signal level is maintained for more than the ramp time of the second differential pair, the output waveform will have a constant value at either a level of $+I_{EE2} \times R24$ or $-I_{EE2} \times R24$, where $I_{EE2}$ is the value of the current that flows through the current sink comprised of the transistor Q25 and the resistor R23. It is not necessary that the value of $I_{EE1}$ be the same as $I_{EE2}$. In fact more waveform constructions are possible if these values are selectable through design considerations.

Figure 9:
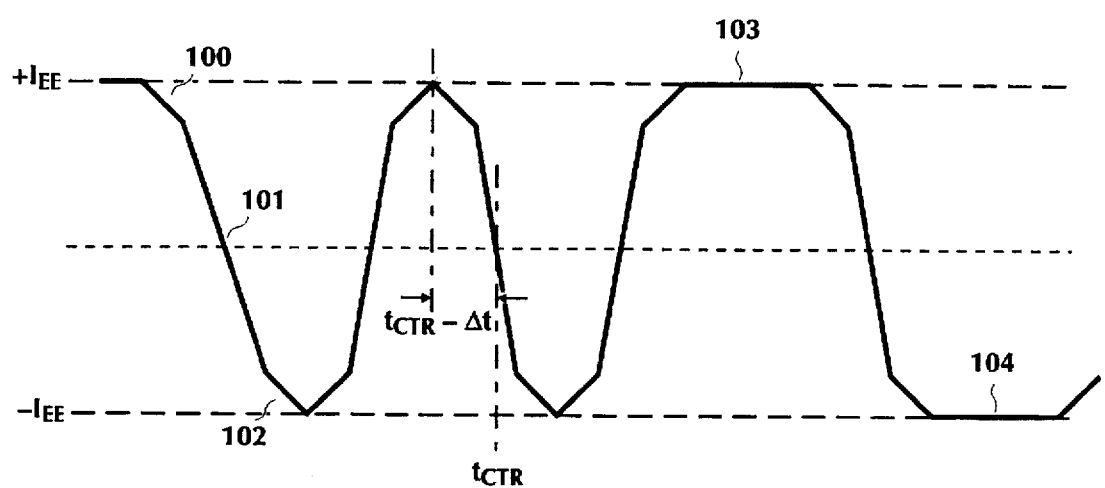
FIG. 9 illustrates a composite waveform formed from the outputs of the first and second differential pairs.

The outputs of the two differential pairs are then combined in a summing circuit and output as the composite waveform illustrated in FIG. 9. The equation that describes the composite output waveform is:

(2) $Vo(t) = R1 \times (I1N - I1) + R1 \times (I2N - I2) + \ldots + Rn \times (InN - In)$ where there are n degenerated differential pairs creating the composite waveform R1, R2, ... Rn are the output resistors corresponding to R24 and R25 of FIG. 3 in each differential pair 1, 2, ..., n, and (3) $InN - In = -I_{EE_n}$,  $\quad t < (t_{ctr} - \Delta t/2)$ $-I_{EE_n} + k\Delta t(t_{ctr} - \Delta t/2 + t)$,  $(t_{ctr} + \Delta t/2) > t > (t_{ctr} - \Delta t/2)$ $+I_{EE_n}$,  $\quad t > (t_{ctr} + \Delta t/2)$ The time $t_{ctr}$ is the center point in time of the composite waveform edge. The time $\Delta t$ can be given by the ratio of the value of the capacitor C1 and the current through the collector of the transistors Q18, Q19 multiplied by the voltage difference 2 $\Delta V$. The constant k for a given differential pair is given by the voltage ratio $V_{R26}/R_{R21}$ as described above. The constant k for a differential pair can also be represented by the equation:

(4) $k = (I_{EE} * R_{degen})/VR21$ where the value $I_{EE}$ is given by the value of $I_{EE}$ for the differential pair and the value $R_{degen}$ is given by the resistor value in the emitter circuit. For the second differential pair of FIG. 3, $R_{degen}$ is equal to the value of the resistor R26. VR21 is the voltage drop across the resistor R21.

The slope of different segments of the composite output waveform illustrated in FIG. 9 can vary because of the different ramp times that each of the differential pairs have. The waveform of FIG. 9 is representative of the sum of the waveforms of FIGS. 7 and 8. The waveform of FIG. 9 has a maximum at $+I_{EE}$ and a minimum at $-I_{EE}$. When the trigger signals TRN, TRP are maintained for more than a time period $\Delta t$ the output waveform will remain constant at either the maximum or minimum value, after that value is reached, according to the values of the nodes N7, N8. The slope of the segment 100 is equal to the slope of the output signal for the first differential pair illustrated in FIG. 7 for the corresponding time period. The slope of the segment 101 is different than the slope of the segment 100 because the slope of the output signal for the second differential pair illustrated in FIG. 8 is added to the slope of the output for the first differential pair. These different slopes for the segment 100 and the segment 101 illustrate how, by using different ramp times for the differential pairs, the composite waveform can be shaped.

It will be apparent to one of ordinary skill in the art that various modifications may be made to the preferred embodiment without departing from the spirit and scope of the invention as defined by the appended claims.

I claim:

1. A degenerated differential pair waveform builder, comprising:

a. means for forming a first ramp signal coupled to receive a first trigger signal and a second trigger signal wherein the first trigger signal is a logical high voltage when the second trigger signal is a logical low voltage and wherein the first trigger signal is a logical low voltage when the second trigger signal is a logical high voltage and further wherein the first ramp signal has a first voltage when the first trigger signal is a logical high voltage and the first ramp signal has a second voltage when the second trigger signal transitions from a logical low voltage to a logical high voltage and wherein the first ramp signal ramps to a third voltage when the first trigger signal is a logical low voltage;

b. means for forming a second ramp signal coupled to receive the first trigger signal and the second trigger signal wherein the second ramp signal has a fourth voltage when the second trigger signal is a logical high voltage and the second ramp signal has a fifth voltage when the first trigger signal transitions from a logical low voltage to a logical high voltage and wherein the second ramp signal ramps to a sixth voltage when the second trigger signal is a logical low voltage;

c. means for forming a first differential output signal according to a first differential gain level coupled to receive the first ramp signal and the second ramp signal;

d. means for forming a second differential output signal according to a second differential gain level coupled to receive the first ramp signal and the second ramp signal, wherein the first differential gain level is not equal to the second differential gain level; and e. means for summing the first differential output signal and the second differential output signal for forming a composite output signal, the means for summing coupled to the means for forming a first differential output signal and coupled to the means for forming a second differential output signal whereby the composite output signal is representative of a sum of the first differential output signal and the second differential output signal.

2. The degenerated differential pair waveform builder according to claim 1 wherein the second voltage is higher than the first voltage and the first voltage is higher than the third voltage.

3. The degenerated differential pair waveform builder according to claim 1 wherein the fifth voltage is higher than the fourth voltage and the fourth voltage is higher than the sixth voltage.

4. The degenerated differential pair waveform builder according to claim 1 wherein the means for forming the first differential output signal is a first differential amplifier circuit.

5. The degenerated differential pair waveform builder according to claim 4 wherein the first differential amplifier circuit has a first non-inverting input, a first inverting input and a first output wherein the first ramp signal is coupled to the first non-inverting input, the second ramp signal is coupled to the first inverting input and the first output forms the first differential output signal.

6. The degenerated differential pair waveform builder according to claim 5 wherein the means for forming the second differential output signal is a second differential amplifier circuit.

7. The degenerated differential pair waveform builder according to claim 6 wherein the second differential amplifier circuit has a second non-inverting input, a second inverting input and a second output wherein the first ramp signal is coupled to the second non-inverting input, the second ramp signal is coupled to the second inverting input and the second output forms the second differential output signal.

8. The degenerated differential pair waveform builder according to claim 1 wherein the means for forming the first differential output signal is a first differential amplifier circuit and the means for forming the second differential output signal is a second differential amplifier circuit and further comprising one or more additional differential amplifier circuits for forming a corresponding number of additional differential output signals, each additional differential amplifier circuit having a corresponding gain and further wherein the summing circuit sums the first differential output signal, the second differential output signal and the additional differential output signals whereby the composite output signal is representative of a sum of the first differential output signal, the second differential output signal and the additional differential output signals.

9. A degenerated differential pair waveform builder, comprising:

a. a ramp generator for forming a first ramp signal at a first node and a second ramp signal at a second node, the ramp generator comprising: a first transistor for coupling and de-coupling the first node to a supply voltage; a second transistor for coupling and de-coupling the second node to the supply voltage; a capacitor coupled between the first node and the second node; a first resistor coupled between the first node and a ground node; and a second resistor coupled between the second node and the ground node;

b. a first differential amplifier for forming a first differential output according to a first differential gain, the first differential amplifier having a first input coupled to the first node and a second input coupled to the second node;

c. a second differential amplifier for forming a second differential output according to a second differential gain wherein the second differential gain is not equal to the first differential gain, the second differential amplifier having a first input coupled to the first node and a second input coupled to the second node; and d. a summing circuit for forming a composite output signal representative of a sum of the first differential output and the second differential output, the summing circuit coupled to sum the first differential output and the second differential output.

10. The degenerated differential pair waveform builder according to claim 9 further comprising a first trigger signal and a second trigger signal wherein the first trigger signal is coupled to control the first transistor and the second trigger signal is coupled to control the second transistor and further wherein the first trigger signal is logical high voltage when the second trigger signal is a logical low voltage and wherein the first trigger signal is a logical low voltage when the second trigger signal is a logical high voltage.

11. The degenerated differential pair waveform builder according to claim 9 wherein the first differential amplifier comprises:

a. a third transistor having a first base, a first emitter and a first collector wherein the first base is coupled to receive the first ramp signal, the first emitter is coupled to the supply voltage through a third resistor and the first collector is coupled to the ground node through a fourth resistor; and b. a fourth transistor having a second base, a second emitter and a second collector wherein the second base is coupled to receive the second ramp signal, the second emitter is coupled to the supply voltage through a fifth resistor and the second collector is coupled to the ground node through a sixth resistor wherein the first differential output is a difference between a voltage at the second emitter and a voltage at the first emitter.

12. The degenerated differential pair waveform builder according to claim 11 wherein the second differential amplifier comprises:

a. a fifth transistor having a third base, a third emitter and a third collector wherein the third base is coupled to receive the second ramp signal, the third emitter is coupled to the supply voltage through a seventh resistor and the third collector is coupled to the ground node through a eighth resistor;

b. a sixth transistor having a fourth base, a fourth emitter and a fourth collector wherein the fourth base is coupled to receive the second ramp signal, the fourth emitter is coupled to the supply voltage through a ninth resistor and the fourth collector is coupled to the ground node through a tenth resistor wherein the second differential output is a difference between a voltage at the fourth emitter and a voltage at the third emitter.

13. The degenerated differential pair waveform builder according to claim 12 further comprising one or more additional differential amplifiers for forming one or more additional differential outputs, each of the one or more differential amplifiers having a differential gain, a first input coupled to the first node and a second input coupled to the second node wherein the summing circuit sums the first differential output, the second differential output and the one or more additional differential outputs, whereby the composite output signal is representative of a sum of the first differential output, the second differential output and the one or more differential outputs.

14. A degenerated differential pair waveform builder, comprising:

a. means for forming a first signal having a first maximum voltage, a first minimum voltage, a first ramp-up time and a first ramp-down time, wherein the first ramp-up time is the time required for the first signal to reach the first maximum from the first minimum voltage and wherein the first ramp-down time is the time required for the first signal to reach the first minimum voltage from the first maximum voltage;

b. means for forming a second signal having a second maximum voltage, a second minimum voltage, a second ramp-up time and a second ramp-down time, wherein the second ramp-up time is the time required for the second signal to reach the second maximum from the second minimum voltage and wherein the second ramp-down time is the time required for the second signal to reach the second minimum voltage from the second maximum voltage and further wherein if the first ramp-up time is equal to the second ramp-up time, the first ramp-down time is not equal to the second ramp-down time the first signal reaches a voltage that is one-half a difference between the first maximum voltage and the first minimum voltage each time that the second signal reaches a voltage that is one-half a difference between the second maximum voltage and the second minimum voltage; and c. means for summing the first signal and the second signal for forming a composite output signal representative of a sum of the first signal and the second signal, wherein the means for summing is coupled to the means for forming the first signal and coupled to the means for forming the second signal.

15. The degenerated differential pair waveform builder according to claim 14 wherein the first maximum voltage is equal to the second maximum voltage and wherein the first minimum voltage is equal to the second minimum voltage.

16. The degenerated differential waveform builder according to claim 15 further comprising means for forming one or more additional signals, each of the one or more additional signals having the first maximum voltage, the first minimum voltage and a corresponding ramp time wherein each of the one or more additional signals reaches the voltage that is one-half the difference between the first maximum voltage and the first minimum voltage at the same time and further comprising means for summing the one or more additional signals to a sum of the first signal and the second signal, whereby the composite output signal is representative of a sum of the first signal, the second signal and the one or more additional signals.

17. A degenerated differential pair waveform builder comprising:

a. means for forming a first ramp signal and a second ramp signal wherein the first ramp signal ramps down after a first trigger signal transitions from a logical high voltage to a logical low voltage and wherein the second ramp signal ramps down after a second trigger signal transitions from a logical high voltage to a logical low voltage and wherein the first trigger signal is a logical high voltage when the second trigger signal is a logical low voltage and wherein the first trigger signal is a logical low voltage when the second trigger signal is a logical high voltage;

b. means for applying a first amplification to the first ramp signal for forming a first amplified signal and for applying a second amplification to the second ramp signal for forming a second amplified signal;

c. means for forming a first differential signal wherein the first differential signal is a difference between the second amplified signal and the first amplified signal;

d. means for applying a third amplification to the first ramp signal for forming a third amplified signal and for applying a fourth amplification to the second ramp signal for forming a fourth amplified signal;

e. means for forming a second differential signal wherein the second differential signal is a difference between the fourth amplified signal and the third amplified signal, wherein the second differential signal is not equal to the first differential signal; and f. means for summing the first differential signal and the second differential signal for forming a composite signal representative of a sum of the first differential signal and the second differential signal.

18. The degenerated differential pair waveform builder according to claim 17 wherein the first ramp signal has a first voltage level when the first trigger signal is a logical high voltage and a second voltage level higher than the first voltage level when the second trigger signal transitions from a logical low voltage to a logical high voltage and wherein the second ramp signal has a third voltage level when the second trigger signal is a logical high voltage and a fourth voltage level higher than the third voltage level when the first trigger signal transitions from logical low voltage to a logical high voltage.

19. The degenerated differential pair waveform builder according to claim 18 wherein the first ramp signal ramps down to a fifth voltage lower than the first voltage level and the second ramp signal ramps down to sixth voltage level lower than the third voltage level.

20. The degenerated differential pair waveform builder according to claim 19 wherein the first ramp signal begins ramping down to the fifth voltage level immediately after reaching the second voltage level and the second ramp signal begins ramping down to the sixth voltage level immediately after reaching the fourth voltage level.

21. The degenerated differential pair waveform builder according to claim 20 wherein the first voltage level is equal to the third voltage level, the second voltage level is equal to the fourth voltage level and the fifth voltage level is equal to the sixth voltage level.

* * * * *

UNITED STATES PATENT AND TRADEMARK OFFICE
CERTIFICATE OF CORRECTION

PATENT NO. : 5,717,350

DATED : February 10, 1998

INVENTOR(S) : Mark William Bohrer

It is certified that error appears in the above-identified patent and that said Letters Patent is hereby correct as shown below:

In column 6, lines 32 and 33, delete "(2) Vo(t) = R1 x (I1N-I1) + R1 x (I2N-I2) + . . . + Rn x (1nN-1n)" and insert --(2) Vo(t) = R1 x (I1N-I1) + R2 x (I2N-I2) + . . . + Rn x (1nN-1n)--.

Signed and Sealed this

Fifth Day of May, 1998

Attest:

Attesting Officer

BRUCE LEHMAN

*Commissioner of Patents and Trademarks*